(12) United States Patent
Hsieh et al.

(10) Patent No.: US 7,161,093 B1
(45) Date of Patent: Jan. 9, 2007

(54) ALIGNING GEAR

(75) Inventors: Chi-Kang Hsieh, Taipei (TW); Kuang-Yi Kao, Taipei (TW); Lin-Wei Chang, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 11/244,277

(22) Filed: Oct. 6, 2005

(51) Int. Cl.
*H05K 7/14* (2006.01)

(52) U.S. Cl. .................. 174/535; 174/138 G; 361/752; 361/683; 312/223.2

(58) Field of Classification Search ................ 174/535, 174/138 G; 361/752, 683, 759; 312/223.2
See application file for complete search history.

(56) References Cited

U.S. PATENT DOCUMENTS

| | | | |
|---|---|---|---|
| 5,414,223 A * | 5/1995 | Suski et al. ................. | 174/262 |
| 6,456,506 B1 * | 9/2002 | Lin ............................. | 361/816 |
| 6,490,168 B1 * | 12/2002 | Rochowicz et al. ........ | 361/784 |
| 6,560,119 B1 * | 5/2003 | Katsuyama et al. ........ | 361/752 |
| 6,751,102 B1 * | 6/2004 | Chen .......................... | 361/758 |
| 6,813,161 B1 * | 11/2004 | Le et al. ..................... | 361/758 |
| 2006/0005992 A1 * | 1/2006 | Pav et al. ............... | 174/138 G |

* cited by examiner

Primary Examiner—Hung V. Ngo
(74) Attorney, Agent, or Firm—Pearl Cohen Zedek Latzer, LLP

(57) ABSTRACT

An aligning gear for an electronic device including a circuit board having at least a first fixing section and a housing having at least a second fixing section is disclosed. The aligning gear includes a first limiting member and a second limiting member, both of which are installed on the housing. The first limiting member limits the circuit board to move along a first direction only, while the second limiting member limits the circuit board to move along a second direction perpendicular to the first direction, so as to make the first fixing section of the circuit board inosculate with the second fixing section of the housing along the first direction and the second direction respectively. Thereby, the circuit board is adjusted to a position where the circuit board is to be fixed to, so as to fix the circuit board on the housing and finish the subsequent fastening action.

18 Claims, 6 Drawing Sheets

ALIGNING GEAR

BACKGROUND OF THE INVENTION

1. Field of the Invention

The present invention relates generally to aligning gears and, more particularly, to an aligning gear for adjusting a position of a circuit board that is to be fixed to a housing.

2. Description of the Background Art

With the explosive development of the electronic technology in recent years, an electronic device is able to provide much more functions. In order to upgrade the processing efficiency of the electronic device, e.g., servo, a variety of functional circuits are installed on a circuit board such as a mother board (MB) of the electronic device. For example, a bard disc drive, an optical disc driver, a battery, a modem, a network card and the like are installed on a front side of the MB. In result, the area of the circuit board becomes larger and larger.

When the circuit board is assembled, a locking component, e.g., screw, bolt and the like, is used to fasten the circuit board to a housing of the electronic device. Preferably, in order to position a fixing point of the circuit board at a corresponding fixing point of the housing as precisely as possible, an action flow for position-adjusting and positioning is performed in advance. Accordingly, a fixing device is installed on the circuit board and the housing to solve the position problem that the fixing point of the circuit board should be positioned at the fixing point of the housing precisely during a fixing procedure. With reference to FIGS. 1A and 1B, shown are structural schematic diagrams of a conventional fixing device. A first fixing section 10 is installed on a rear side of a circuit board 1 against a housing 2. The first fixing section 10 comprises a lockhole 100 and a stroke slot 102 installed along a second direction and connected with the lockhole 100. A slot width of the stroke slot 102 is a bit less than the diameter of the lockhole 100. Accordingly, with reference to FIGS. 1B and 1C, a second fixing section 20 is installed on the housing 2 at a position corresponding to the lockhole 100 of the circuit board 1. The second fixing section 20 has a structure of a locking lug 200, similar to the structure of a screw. The locking lug 200 comprises a cap top 202. When the circuit board 1 is assembled on the housing 2, the action flow for position-adjusting and positioning is performed in advance. First, the action flow aligns the relation position between the lockhole 100 of the circuit board 1 and the locking lug 200 of the housing 2 corresponding to the lockhole 100. Then the action flow posts the locking lug 200 into the lockhole 100, and pushs the circuit board 1 to move along the second direction with a leveling thrust, making the locking lug 200 of the housing 2 be blocked into the stroke slot 102 by virtue of the stroke slot 102 of the circuit board 1. Since the diameter of the cap top 202 of the locking lug 200 is larger than the slot width of the stroke slot 102, the circuit board 1, after being blocked into the stroke slot 102, can be fixed to the housing 2 by a blocking member of the cap top 202. Lastly, a first fastening section 12 such as a through hole of the circuit board 1, together with a second fastening section 22 such as a threaded hole of the housing 2 and a locking component such as a screw, fixes the circuit board 1 onto the housing 2.

As described above, the action flow is performed completely through the use of manpower and subjective action. However, the circuit board 1 is fully matched to a frame of the housing 2, so it is quite inconvenient to adjust the relative position of the circuit board 1 and the housing 2 to fix the circuit board 1 onto the housing 2 during assembling. Moreover, the first fixing section 12 of the circuit board 1 is installed on the rear side of the circuit board 1 against the housing 2, so a users can not efficiently observe the position where the first fixing section 12 is exactly located, and can do nothing but relies on his personal experience to fix the circuit board 1 onto the housing 2, which requires a long period for practicing, thereby affecting the efficiency and performance to fixing the circuit board 1 onto the housing 2.

Accordingly, there exists a strong need in the art for an aligning gear for aligning the position of the circuit board fixed to the housing to avoid the complex and inconvenient operation like the conventional technology, so as to quickly and exactly align the position for assembling reciprocally, which is provide for fixing and the subsequent fastening action.

SUMMARY OF THE INVENTION

Accordingly, it is an objective of the present invention to solve the aforementioned problems by providing an aligning gear, making the circuit and housing quickly and exactly align the fixing position.

It is another objective of the present invention to provide an aligning gear with a simplified action flow for operating.

It is a further objective of the present invention to provide an aligning gear to promote the working efficiency.

In order to attain the object mentioned above and the others, an aligning gear according to the present invention is proposed. The aligning gear is applied to an electronic device including a circuit board having at least a first fixing section and a housing having at least a second fixing section. The aligning gear includes at least a first limiting member and at least a second limiting member, both of which are installed on the housing. The first limiting member limits the circuit board to move along a first direction, so as to make the first fixing section of the circuit board inosculate with the second fixing section of the housing along the first direction. The second limiting member limits the circuit board along a second direction perpendicular to the first direction, so as to make the first fixing section of the circuit board inosculate with the second fixing section of the housing along the second direction. Thereby, the circuit board can be quickly and exactly aligned to the position where the circuit board is to be fixed to the housing, so as to fix the circuit board on the housing and finish the subsequent fastening action.

According to the preferred embodiment, the first fixing section has a lockhole structure. Preferably, the first fixing section includes a stroke slot. The second fixing section has a locking lug structure, and is used to be engaged with the lockhole structured first fixing section and entered into the stroke slot by a level thrust.

Preferably, the first limiting member is placed in a region inside of ends of both side mantles of the housing along the first direction, and is in the shape of a bulge for example; the second limiting member is placed in another region outside of the fixing position of the housing corresponding to the circuit board. The second fixing section includes a stopper for stopping the circuit board from being shifted and a connector for connecting the housing. Through the matching between the first limiting member and the second limiting member, the circuit board is limited to move nowhere but along the first direction and the second direction. Thereby, the circuit board can be quickly and exactly aligned to the position where the circuit board is to be fixed to the housing.

As described above, the aligning gear of the present invention aligns the fixing position of the circuit board that are to be assembled and the housing, thereby the circuit board and the housing can quickly and exactly align the fixing position, so as to fix the circuit board and finish the subsequent fastening action, and avoid the complex and inconvenient operation like the conventional technology, which results in erroneous operation and lower working efficiency.

DESCRIPTION OF THE PREFERRED EMBODIMENTS

The following description contains specific information pertaining to the implementation of the present invention. One skilled in the art will readily recognize other advantages and features of the present invention after reviewing what specifically disclosed in the present application. It is manifest that the present invention can be implemented and applied in a manner different from that specifically discussed in the present application. It should also be understood that the invention is not limited to the particular exemplary embodiments described herein, but is capable of many rearrangements, modifications, and substitutions without departing from the spirit of the present invention. Wherein, attention that the drawings according to the present invention are all simplified schematic diagrams should be paid to, i.e., they merely illustrate the components pertaining to the invention, and it is not limited to the components what illustrated, the number of the components, shape or proportion of size when actually implementing is a selective design, the layout of the component may be more complex.

The following embodiments further describe the technique means of the present invention in detail, but it is not used to limit the scope of the present invention.

Figure 1A:
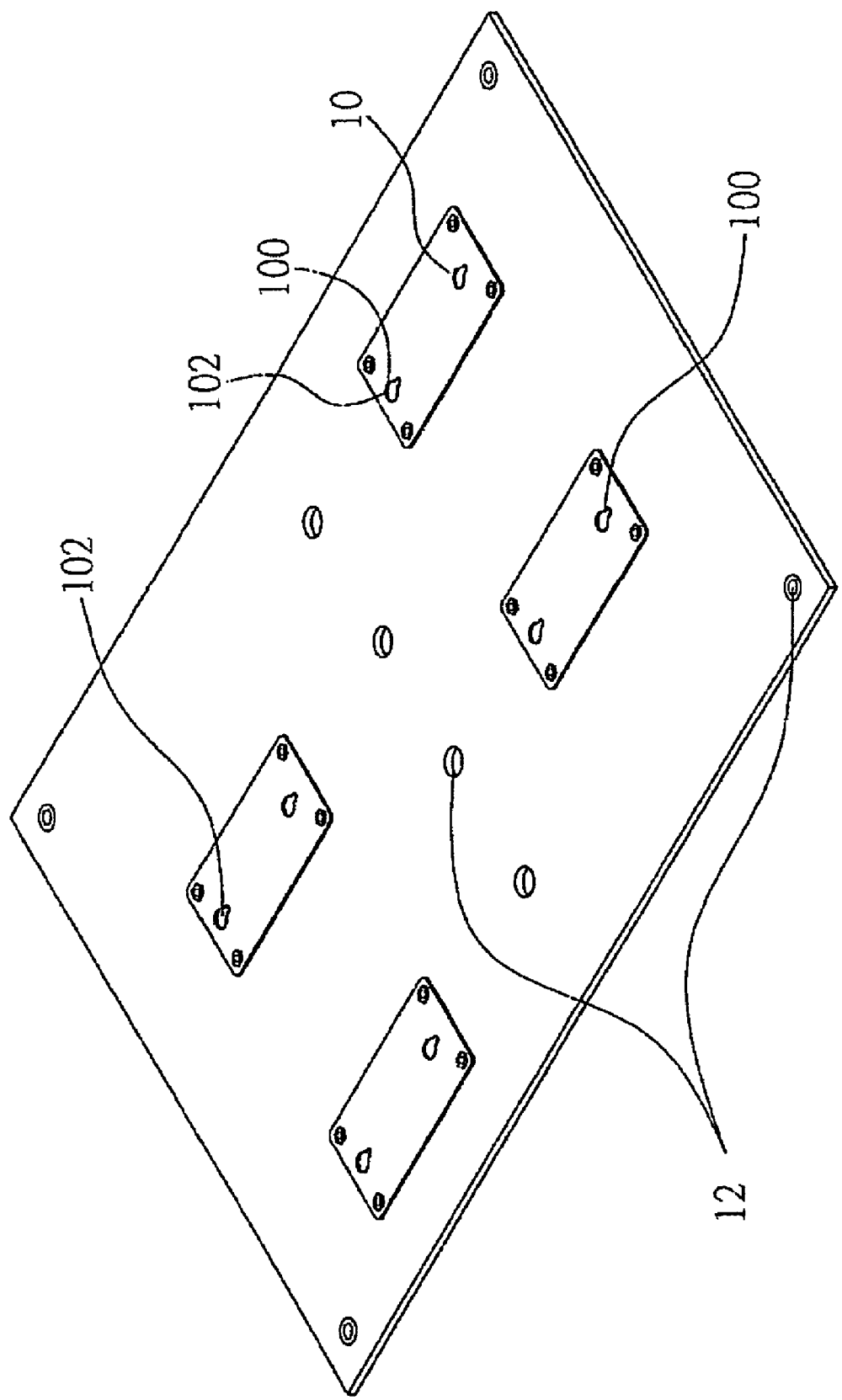
FIG. 1A depicts a structural schematic diagram of a circuit board according to a conventional fixing device
Figure 1B:
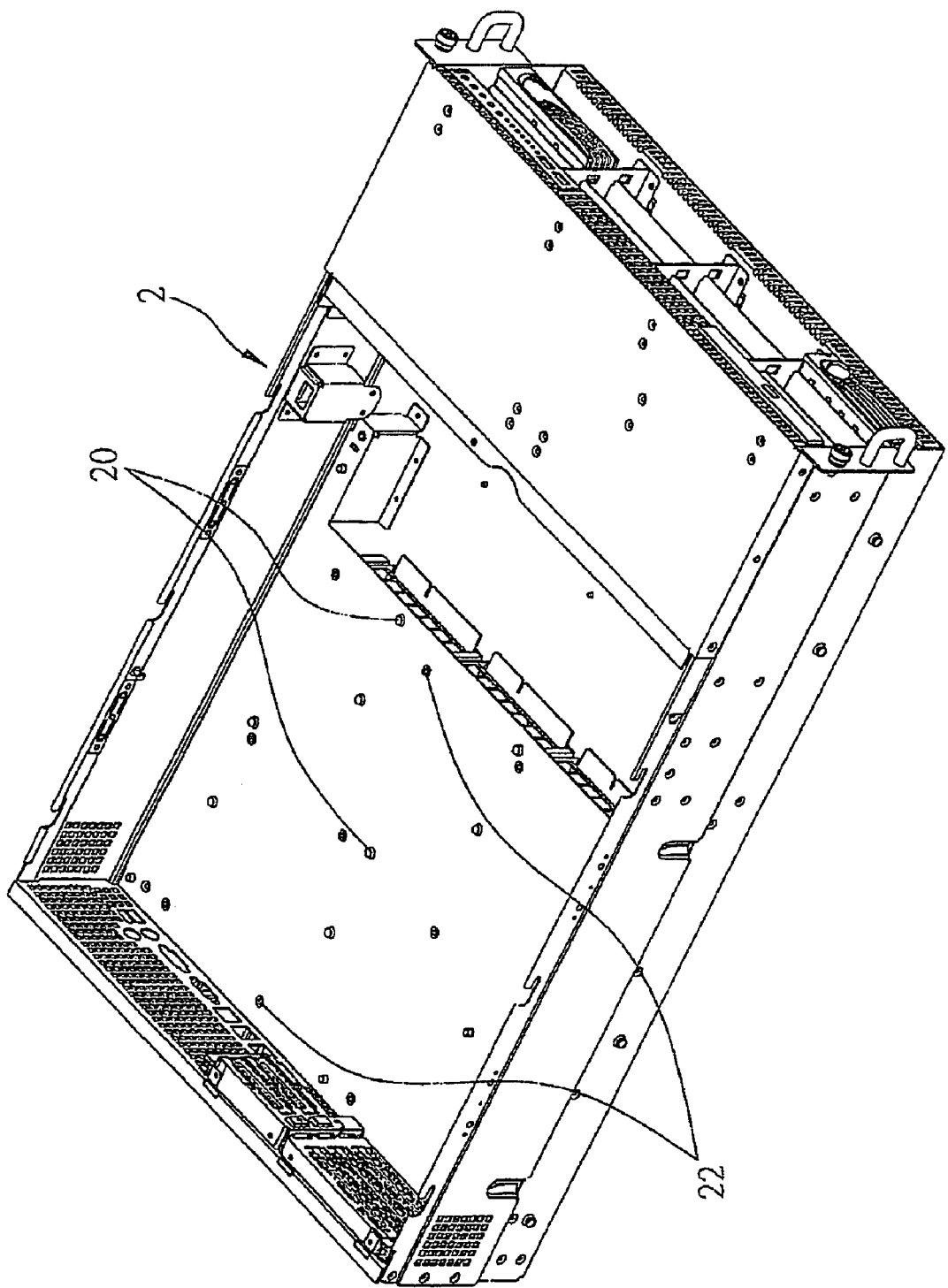
FIGS. 1B and 1C depict structural schematic diagrams of a housing according to the conventional fixing device shown in FIG. A.
Figure 1C:
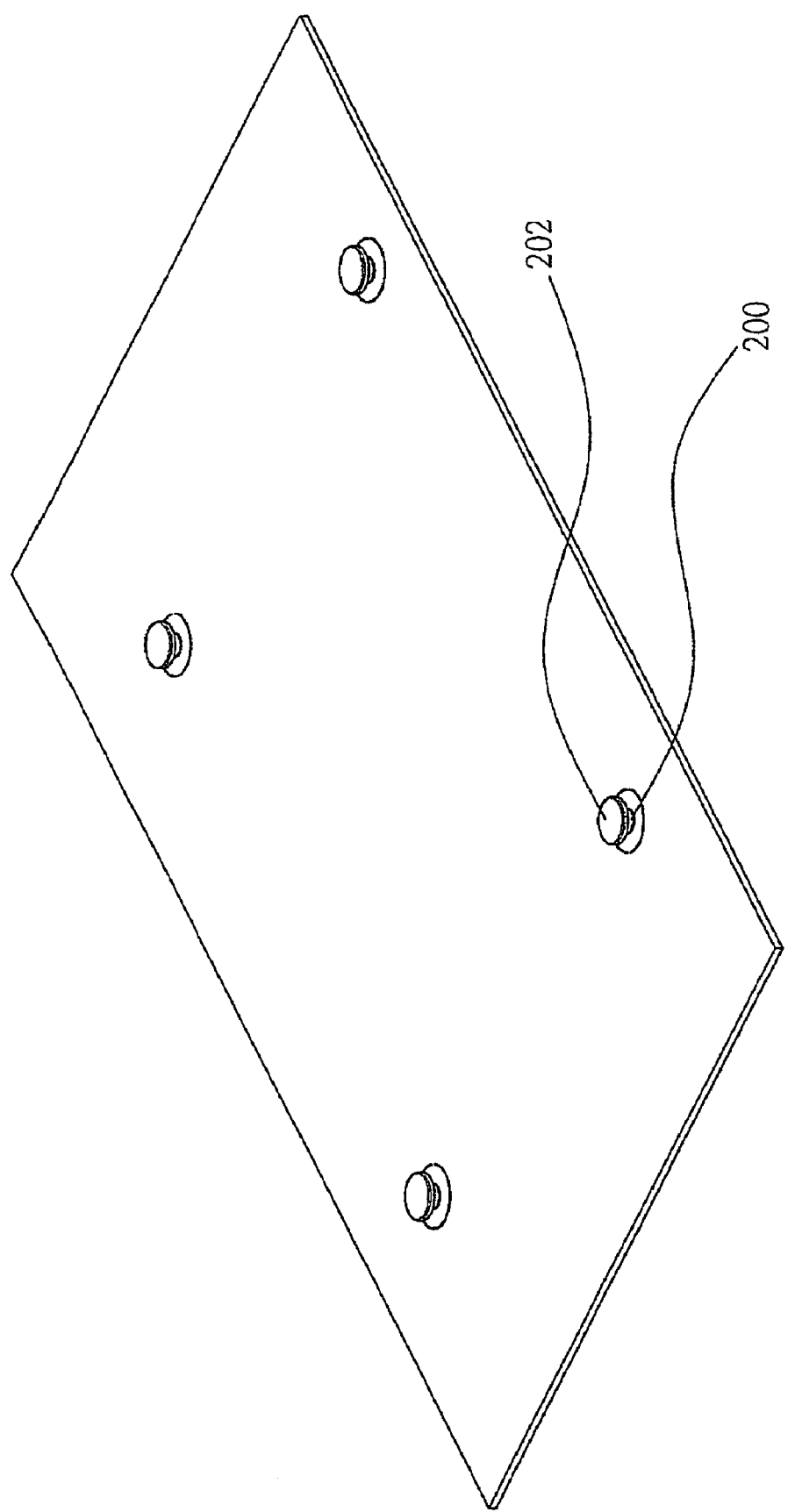
Figure 2:
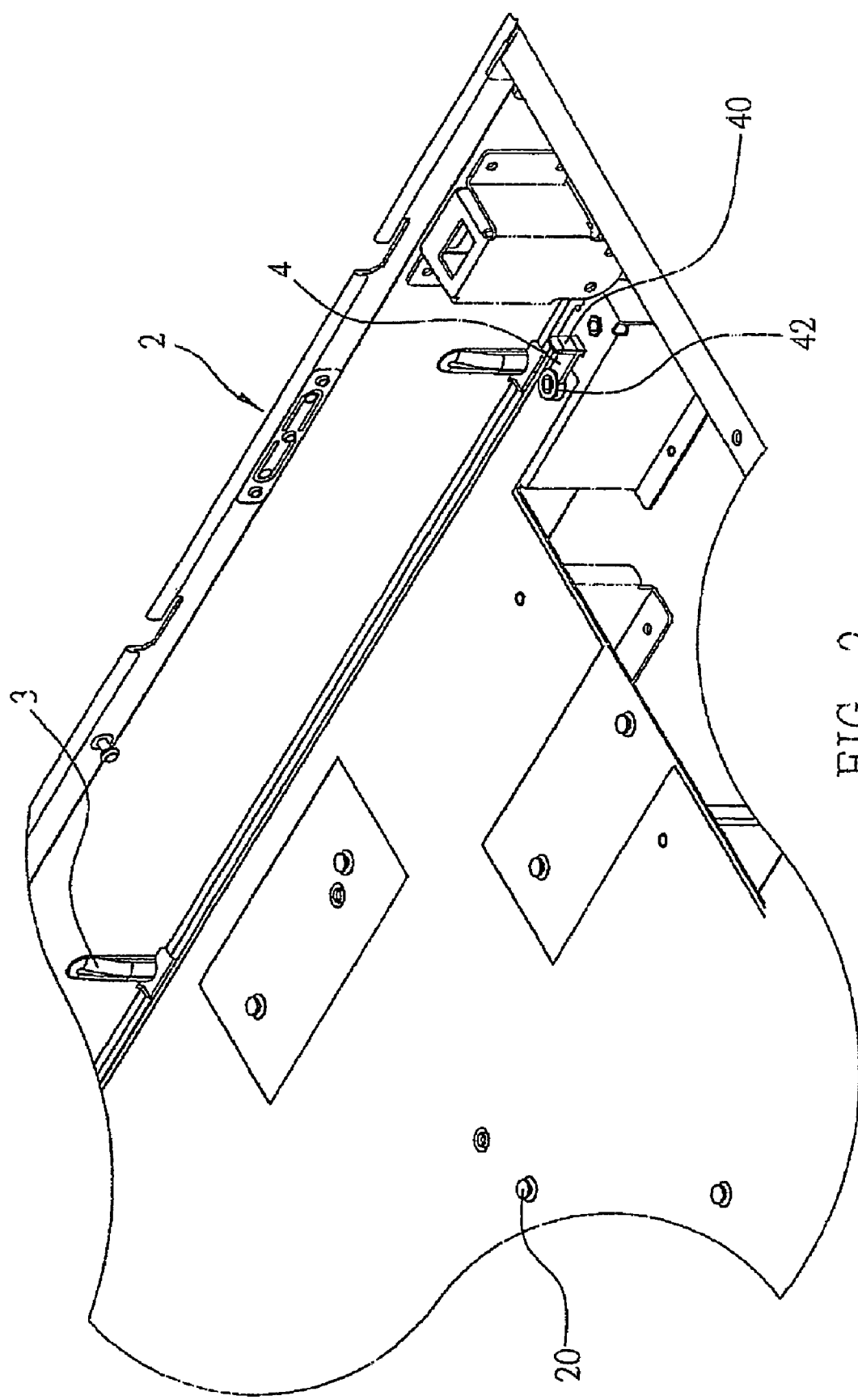
FIG. 2 depicts a structural schematic diagram of a aligning gear according to the present invention.

With reference to FIG. 2, shown is a structural schematic diagram of a aligning gear according to the present invention. The aligning gear is applied in a electronic device, e.g., a servo, a desktop computer, a notebook computer, and is used to align the electronic device, e.g., a relative position between the circuit board 1 and the housing 2, so as to fix the circuit board 1 onto the housing 2. A first fixing section 10, e.g., a lockhole and a stroke slot, is installed on a rear side of the circuit board 1. A second fixing section 20, e.g., a locking lug, corresponding to the first fixing section 10 and is installed on the housing 2. Since the conventional circuit board 1 is applicable object, its structure is not changed, for simplicity, in order to illustrate the feature and structure of the present invention in a more clear and concise, merely the structure directly pertaining to the present invention is illustrated, the other is left out.

As shown in FIG. 2, the aligning gear is applied in an electronic device comprising the circuit board 1 and the housing 2. The aligning gear comprises a first limiting member 3 and a second limiting member 4. In this embodiment, the first limiting member 3 is a metal slope, and the second limiting member 4 is a plastic insulator.

The first limiting member 3 is placed in a region inside of two side mantles 21, 21' of the housing 2 along the first direction, for limiting a degree of shifting freedom of the circuit board 1 along a first direction. The first fixing section 10 of the circuit board 1 therefore inosculates with the second fixing section 20 of the housing 2 along the first direction. A width of a space of the first limiting member 3 along the first direction is preferably set to be equal to a width of the circuit board 1. Therefore, the circuit board 1 can be assembled easily with the housing 2. In the embodiment, the first limiting member 3 is a metal slope formed by the housing 2 to punch at the side mantles 21, 21' along the first direction. Certainly, one skilled in the art can realize that the structure of the first limiting member 3 is not limited to what described in this embodiment and can be changed as required. For example, the first limiting member 3 can be installed symmetrically, or be formed solely, without the punching process at the side mantles 21, 21'.

The second limiting member 4 comprises a stopper 40 and a connector 42. The stopper 40 has a blocking bar structure for example, and is placed in a region outside of the housing 2 corresponding to a mounting region of the circuit board 1 along the second direction, and has a stroke space reserved for the circuit board 1 to move along the second direction, so as to limit the degree of shifting freedom of the circuit board 1 along the second direction. Therefore, the first fixing section 10 of the circuit board 1 can inosculate along the second direction with the corresponding position of the second fixing section 20 of the housing 2, and the circuit board 1 can be fixed to the housing 2 due to a certain leveling thrust along the second direction. The connector 42 has a split ring structure installed for a locking component, e.g., a screw, to fix the second limiting member 4 onto the housing 2. Although the embodiment provides two second limiting members 4 on both side mantles 21, 21' of the housing 2, other embodiments of the present invention can provide the second limiting member 4 with any number or different installation position. For example, a single second limiting member 4 is installed in a central region of the housing 2, such a configuration achieving equivalent function.

When the first limiting member 3 is engaged with the second limiting member 4, the circuit board 1 can be confined within a certain region, and the first fixing section 10 can inosculate with a corresponding position of the second fixing section 20 of the housing 2, to accelerate an assembly process.

Figure 3:
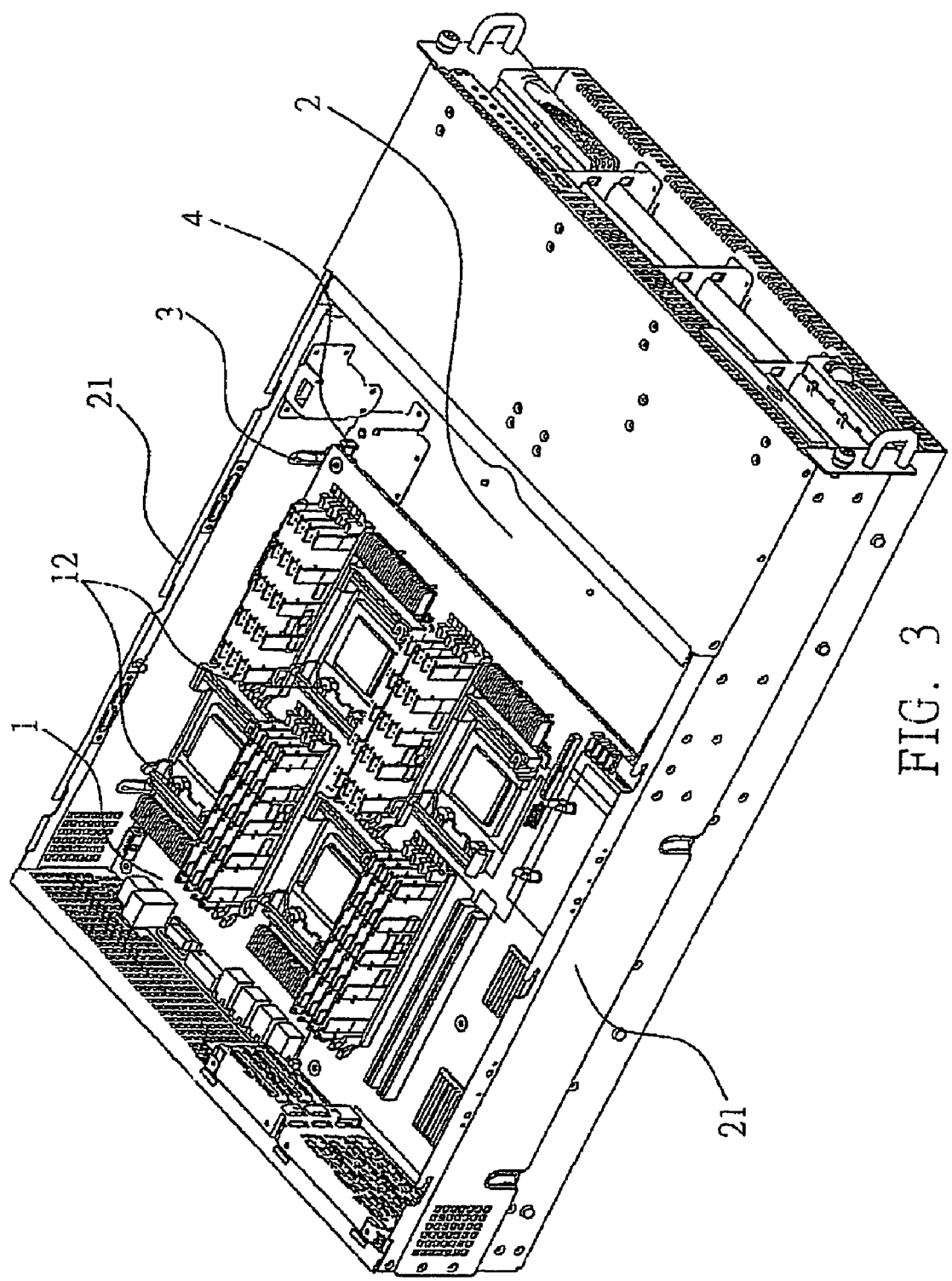
FIG. 3 depicts a schematic diagram of the preferable exemplary embodiment according to the aligning gear of the present invention.
Figure 4:
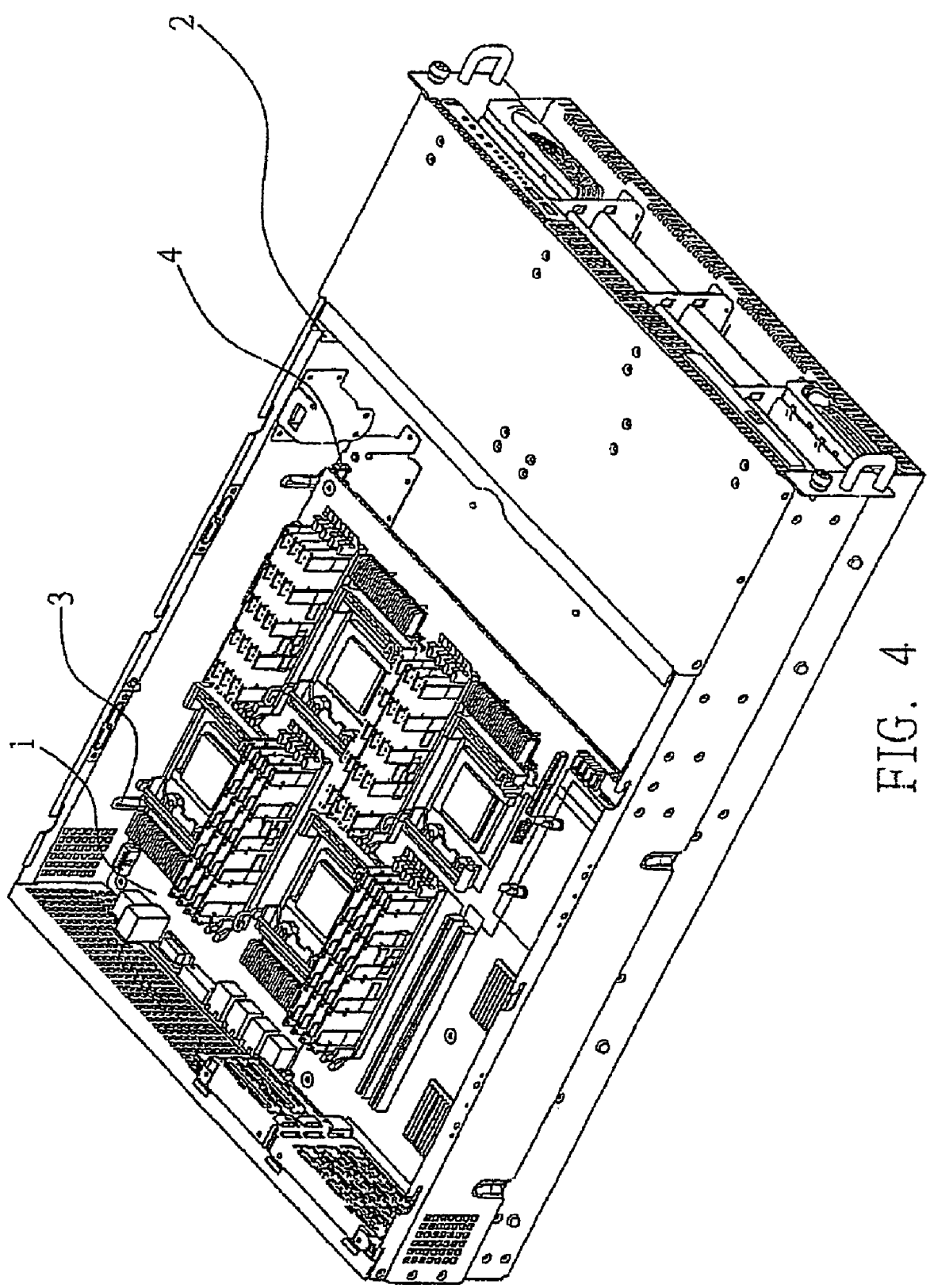
FIG. 4 depicts a schematic diagram of the using state after applying the aligning gear according to the present invention to the circuit board assembly

With reference to FIGS. 3 and 4, shown are schematic diagrams of the preferable exemplary embodiment according to the aligning gear of the present invention. Referring to FIG. 3, the aligning gear according to the present invention is applied in an electronic device comprising a circuit board 1 having at least a first fixing section 10 and a housing 2 having at least a second fixing section 20. The circuit board 1 is an MB for example. At least an electronic component, e.g., a hard disc, a CD-ROM, a battery, a data modem, a network card and the like, is installed on a front side of the circuit board 1, while the first fixing section 10, e.g., a lockhole, is installed on a rear side of the circuit board 1. In accordance, the housing 2 comprises various side mantles and assembling surfaces for assembling the circuit board 1. A second fixing section 20 such as a locking lug is installed on the assembling surface. As far as assembly is concerned, the first fixing section 10, e.g., lockhole, of the circuit board 1 is aimed at the second fixing section 20, e.g., locking lug, of the corresponding housing 2, making the circuit board 1 fix on the housing 2 through the mutual function of the first fixing section 10 and the second fixing section 20, then, by virtue of the first fastening section 12, e.g., through hole, provided by the circuit board 1, the second fastening section 22, e.g., threaded hole, provided by the housing 2 and the locking component, e.g., screw, fastening the circuit board 1 to the housing 2, so as to finish the assembling operation. The structure design and assembling method of the circuit board 1 which are not characteristic of the present invention or the patent feature of what to be applied are often applied in the conventional technology, so these will not be described again.

The aligning gear of the present invention aligns the relative position of the circuit board 1, e.g., MB, and the housing 2 when the circuit board 1 and the housing 2 are assembled, so as to fix the circuit board 1 to the housing 2. In practice, the circuit board 1 is placed in the assembling region of the housing 2, and pushed along the second direction to lean against the second limiting member 4. Since the space width along the first direction of the first limiting member 3 is designed to be equal to the width of the circuit board 1, which is to be assembled along the first direction, the first fixing section 10 of the circuit board 1 can inosculate with the second fixing section 20 of the housing 2 or at least can be placed at the neighborhood after being lay down the circuit board 1. Thus, it is not necessary to adjust again along the first direction; along the second direction, the first fixing section 10, e.g., lockhole, of the circuit board 1 is also exactly inosculated with the second fixing section 20, e.g., locking lug, corresponding to the first fixing section 10 of the housing 2 in the exemplary embodiment. The first fixing section 10 comprises a lockhole 100 and a stroke slot 102, and the second fixing section 20 comprises a locking lug 200 and a cap top 202. When the locking lug 200 is posting into the lockhole 100, and then the circuit board 1 is leaving from the second limiting member 4 along the first direction due to the leveling thrust, since the diameter of the cap top 202 of the locking lug 200 is larger than the slot width of the stroke slot 102, the locking lug 200 will enter into the stroke slot 102 and stop by the blocking of the cap top 202, and in result the circuit board 1 is fixed to the housing 2. Thus, the flow of fastening action for completing assembly is often applied in the conventional technology, and will not be described again, with reference to FIG. 4, shown is a schematic diagram of the using state after applying the aligning gear according to the present invention to the circuit board assembly.

As described above, the aligning gear of the present invention aligns the fixing position of the circuit board to the housing through the use of a matching mechanism preformed by the first limiting member 3 and the second limiting member 4. Therefore, the circuit board 1 and the housing 2 can be aligned to the fixing position quickly and exactly, so as to avoid the complex and inconvenient operation like the conventional technology, which results in erroneous operation and lower working efficiency.

By virtue of the above-discussed indicating system and method, the user can conveniently and exactly implement corresponding operation by the indicating function with multiple forms without complex ibulgeifying operation, and can adroitly grip the operating function of the electronic device.

The above-described exemplary embodiments are to describe various objects and features of the present invention as illustrative and not restrictive of the scope of the essential technical content according to the present invention, the essential technical content of the present invention is broadly defined in the appended claim, if the exemplary embodiments or method implemented by any one are completely identical to the following claim or only an equivalent change of the following claim, all that is considered to fall with the scope of the invention.

What is claimed is:

1. An aligning gear for an electronic device comprising a circuit board having at least a first fixing section and a housing having at least a second fixing section, the aligning gear comprising:
   at least a first limiting member installed on the housing for limiting a degree of shifting freedom of the circuit board along a first direction, so as to make the first fixing section of the circuit board inosculate with the second fixing section of the housing along the first direction; and
   at least a second limiting member installed on the housing for limiting a degree of shifting freedom of the circuit board along a second direction perpendicular to the first direction, so as to make the first fixing section of the circuit board inosculate with the second fixing section of the housing along the second direction.

2. The aligning gear of claim 1, wherein the electronic device is a servo.

3. The aligning gear of claim 1, wherein the circuit board is a mother board (MB).

4. The aligning gear of claim 3, wherein the first fixing section is in the shape of a lockhole.

5. The aligning gear of claim 1, wherein the first fixing section comprises a stroke slot.

6. The aligning gear of claim 1, wherein the second fixing section is a locking lug.

7. The aligning gear of claim 6, wherein the locking lug comprises a top cap.

8. The aligning gear of claim 1, wherein the first limiting member is placed in a region inside ends of both side mantles of the housing along the first direction.

9. The aligning gear of claim 8, wherein the first limiting member is a bulge.

10. The aligning gear of claim 9, wherein the bulge is in the shape of a slope.

11. The aligning gear of claim 1, wherein the second limiting member is placed in a region outside of the housing and corresponding to a mounting region of the circuit board, and comprises a stroke space for movement of the circuit board along the second direction.

12. The aligning gear of claim 1, wherein the second limiting member comprises a stopper and a connector.

13. The aligning gear of claim 12, wherein the stopper is a blocking bar.

14. The aligning gear of claim 12, wherein the connector is a split ring for fixing the second limiting member to the housing.

15. The aligning gear of claim 1, wherein the circuit board further comprises a first fastening section.

16. The aligning gear of claim 15, wherein the first fastening section is a through hole.

17. The aligning gear of claim 1, wherein the housing further comprises a second fastening section.

18. The aligning gear of claim 17, wherein the second fastening section is a threaded hole.

* * * * *